(12) United States Patent
Nalla et al.

(10) Patent No.: US 7,825,022 B2
(45) Date of Patent: Nov. 2, 2010

(54) METHOD OF ENABLING SOLDER DEPOSITION ON A SUBSTRATE AND ELECTRONIC PACKAGE FORMED THEREBY

(75) Inventors: Ravi Nalla, Chandler, AZ (US); Charavana Gurumurthy, Higley, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/387,417

(22) Filed: Apr. 30, 2009

(65) Prior Publication Data

US 2009/0277866 A1 Nov. 12, 2009

Related U.S. Application Data

(62) Division of application No. 11/507,697, filed on Aug. 21, 2006, now Pat. No. 7,538,429.

(51) Int. Cl.
*H01L 21/44* (2006.01)

(52) U.S. Cl. ............ 438/612; 438/613; 438/618; 438/623; 438/637; 438/642; 257/E23.021

(58) Field of Classification Search .............. None
See application file for complete search history.

(56) References Cited

U.S. PATENT DOCUMENTS

| 7,413,771 B2 * | 8/2008 | Arora et al. ............ 427/216 |
| 7,413,805 B2 * | 8/2008 | Khaselev et al. ......... 428/403 |
| 7,678,255 B2 * | 3/2010 | Khaselev et al. ......... 204/490 |

* cited by examiner

*Primary Examiner*—Zandra Smith
*Assistant Examiner*—Khanh B Duong
(74) *Attorney, Agent, or Firm*—Kenneth A. Nelson

(57) ABSTRACT

An electronic package includes a substrate (110, 310, 510) and a solder resist layer (120, 320, 520) over the substrate. The solder resist layer has a plurality of solder resist openings (121, 321, 521) therein. The electronic package further includes a finish layer (130, 330, 535) in the solder resist openings, an electrically conducting layer (140, 440) in the solder resist openings over the finish layer, and a solder material (150, 810) in the solder resist openings over the electrically conducting layer. The electrically conducting layer electrically connects the solder resist openings in order to enable the electrokinetic deposition of the solder material.

13 Claims, 7 Drawing Sheets

US 7,825,022 B2

METHOD OF ENABLING SOLDER DEPOSITION ON A SUBSTRATE AND ELECTRONIC PACKAGE FORMED THEREBY

CLAIM OF PRIORITY

This application is a divisional of U.S. patent application Ser. No. 11/507,697 which was filed on Aug. 21, 2006 now U.S. Pat. No. 7,538,429 and for which a Notice of Allowance was mailed on Jan. 15, 2009.

FIELD OF THE INVENTION

The disclosed embodiments of the invention relate generally to microelectronics packaging and relate more particularly to techniques for substrate solder bumping.

BACKGROUND OF THE INVENTION

For many years a trend in the microelectronics industry has been to place an increasing number of microelectronic devices in an increasingly smaller area. As a result, the components of the microelectronics devices must themselves decrease in size and spacing. One component of microelectronic devices that is under such size pressure is the array of solder bumps that is used in mounting techniques such as flip chip or controlled collapse chip connect (C4) technology. Conventional stencil mask printing technology that is currently in wide use for such substrate solder bumping, when used for high density interconnect (HDI) substrates, causes significant bump height variation, bump bridging, and low volume and missing solder bump issues, which often result in severe problems during chip attachment. As an example, local mask deformation can lead to solder paste bleeding between solder resist openings (SROs), resulting in bridged bumps. Another common problem is that upon mask lift-off, a considerable amount of solder paste adhering to the walls of the mask apertures is taken away, which also leads to severe bump height variation, particularly for smaller SRO sizes. Next generation HDI substrates are projected to have a minimum pitch of 150 micrometers and lower, so stencil printing will likely only become more problematic. In fact, poor yields caused by the foregoing and other problems have been observed even at pitches of 150 micrometers.

The foregoing and other issues have prompted attempts to develop alternative substrate solder bumping technologies. One such technology deals with electrokinetic particle deposition in a fluidized bed, a technique originally developed for wafer bumping. Electrokinetic deposition, however, requires that the deposition surface be electrically conductive, a requirement that is inherently satisfied for wafers but not for substrates. Accordingly, there exists a need for a method of enabling electrokinetic solder deposition for fine pitch substrate bumping.

BRIEF DESCRIPTION OF THE DRAWINGS

The disclosed embodiments will be better understood from a reading of the following detailed description, taken in conjunction with the accompanying figures in the drawings in which.

Figure 1:
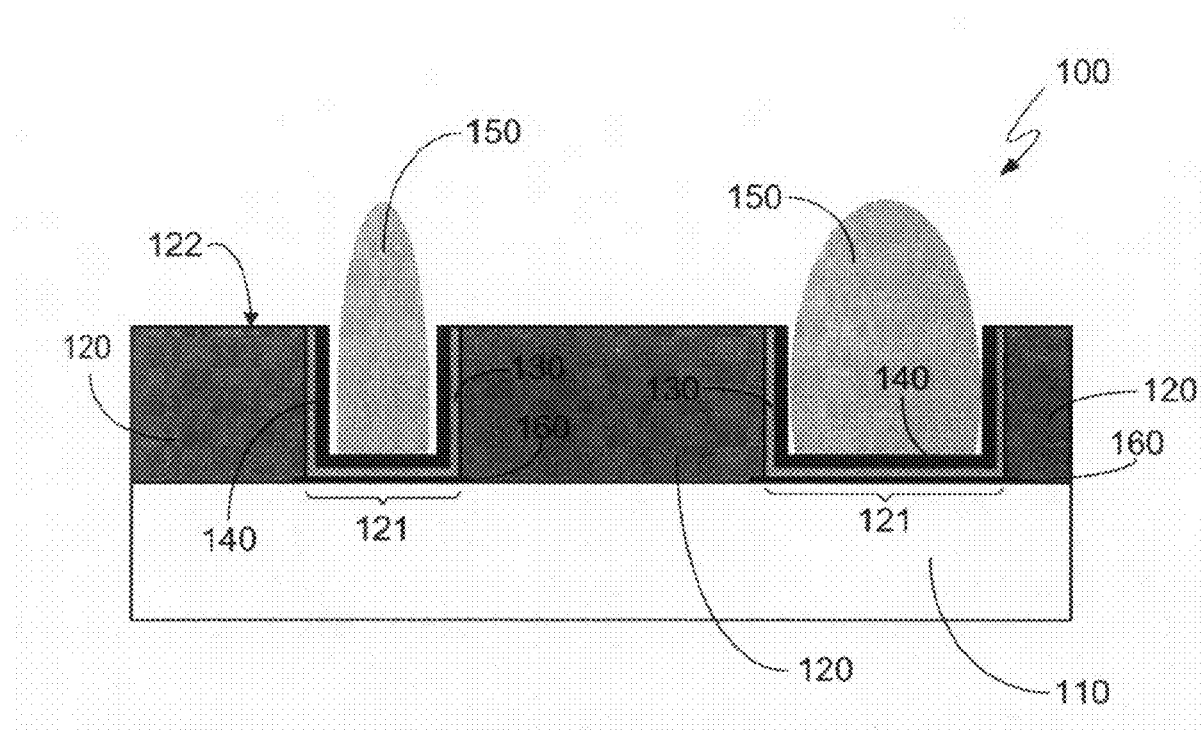
FIG. 1 is a cross-sectional view of an electronic package according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner.

DETAILED DESCRIPTION OF THE DRAWINGS

In one embodiment of the invention, an electronic package comprises a substrate and a solder resist layer over the substrate. The solder resist layer has a plurality of solder resist openings therein. The electronic package further comprises a finish layer in the solder resist openings, an electrically conducting layer in the solder resist openings over the finish layer, and a solder material in the solder resist openings over the electrically conducting layer. The electrically conducting layer electrically connects the solder resist openings in order to enable the electrokinetic deposition of the solder material. More specifically, the electrokinetic deposition technique deposits solder material only where there is an exposed electrically conducting layer, a fact that is exploited by embodiments of the invention as will be described below. A purpose of the finish layer will also be discussed below.

Referring now to the figures, FIG. 1 is a cross-sectional view of an electronic package 100 according to an embodiment of the invention. As illustrated in FIG. 1, electronic package 100 comprises a substrate 110 and a solder resist layer 120 over substrate 110. Solder resist layer 120 has a surface 122 and a plurality of solder resist openings 121 therein. A finish layer 130 is located in solder resist openings 121, and an electrically conducting layer 140 is located over finish layer 130. Electronic package 100 further comprises a solder material 150 in solder resist openings 121 over electrically conducting layer 140 and finish layer 130. Bond pads 160 are located at solder resist openings 121 under finish layer 130.

FIG. 1 depicts finish layer 130, solder material 150, and bond pads 160 as being located in or adjacent to both of the illustrated solder resist openings 121. The implication is that finish layer 130, solder material 150, and bond pads 160 are located in or adjacent to all of the solder resist openings in solder resist layer 120 of electronic package 100. Such an arrangement is typical. However, it would be possible, though highly unusual, to place finish layer 130, solder material 150, and/or bond pads 160 in or adjacent to fewer than all of solder resist openings 121, and it should be understood that the current disclosure and the accompanying claims do not preclude that less typical arrangement.

FIG. 1 depicts electronic package 100 at a particular point in a manufacturing process according to an embodiment of the invention. Electronic packages in various other stages of processing according to embodiments of the invention are shown in certain subsequent figures, and will be discussed below.

In addition to other possible advantages, finish layers provide protection for underlying layers in a package or device. In one embodiment, finish layer 130 comprises a layer of nickel underlying a layer of gold. In a particular embodiment finish layer 130 comprises an immersion gold (IG) layer, and in the same or another embodiment finish layer 130 may also comprise an electrolytic gold (EG) layer, an electroless palladium layer or another electroless layer, or the like. Some finish layers have various components, each of which provides a particular advantage or set of advantages. As an example, gold prevents oxidation and decreases resistance, so gold is commonly used as a component of finish layers. However, gold baths may be corrosive to certain materials, including nickel, and so an additional material such as palladium or the like will often be included in the finish layer in order to act as a buffer or barrier between the nickel or other material and the gold in order to prevent such corrosion.

Figure 5:
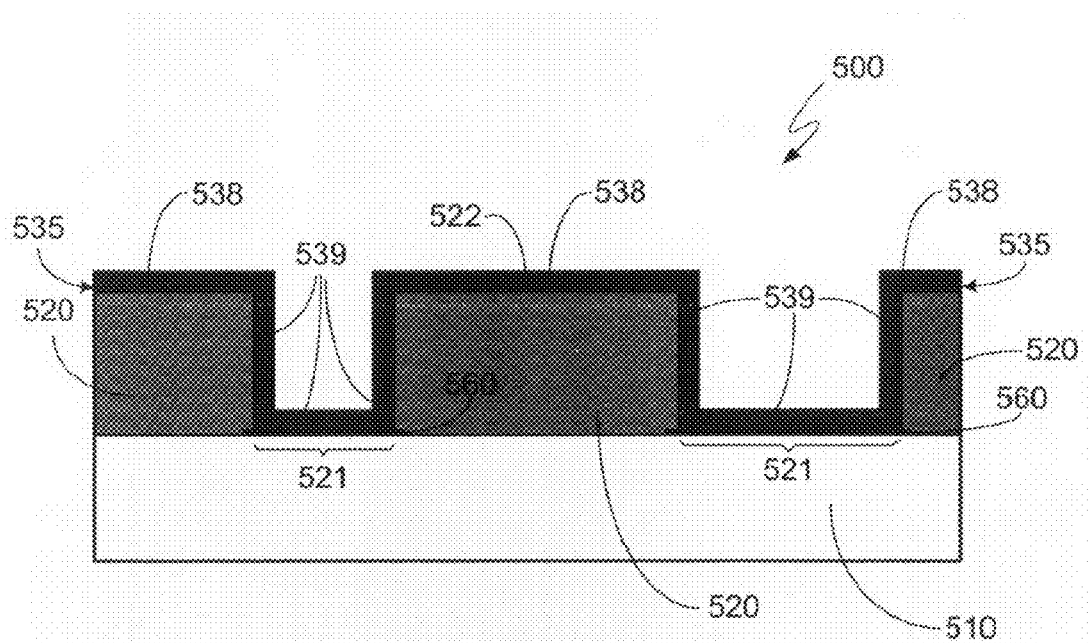
FIG. 5 is a cross-sectional view of an electronic package at a particular point in a manufacturing process according to a different embodiment of the invention.

It was mentioned above that electrically connecting the solder resist openings enables the electrokinetic deposition of solder material on electronic package 100. In one embodiment, such electrical connection is provided by extending finish layer 130, or a portion thereof, across surface 122 of solder resist layer 120 such that finish layer 130 is on surface 122 as well as in solder resist openings 121, thus electrically connecting solder resist openings 121 to each other. In that embodiment, electrically conducting layer 140 may be omitted from electronic package 100 because its function is performed by finish layer 130 or a portion thereof. (An electronic package having a finish layer that performs functions of both a traditional finish layer and of electrically conducting layer 140 is illustrated in FIG. 5.)

In devices where the formation of a finish layer is already a part of the manufacturing process, the extension of a portion of the finish layer across the surface of the solder resist layer requires minimal, if any, changes to that process flow. For such devices, both the portion of the finish layer that is over the surface of the solder resist layer and the portion of the finish layer that is in the solder resist openings can be deposited in a single processing step because they are both portions of a single layer.

Figure 8:
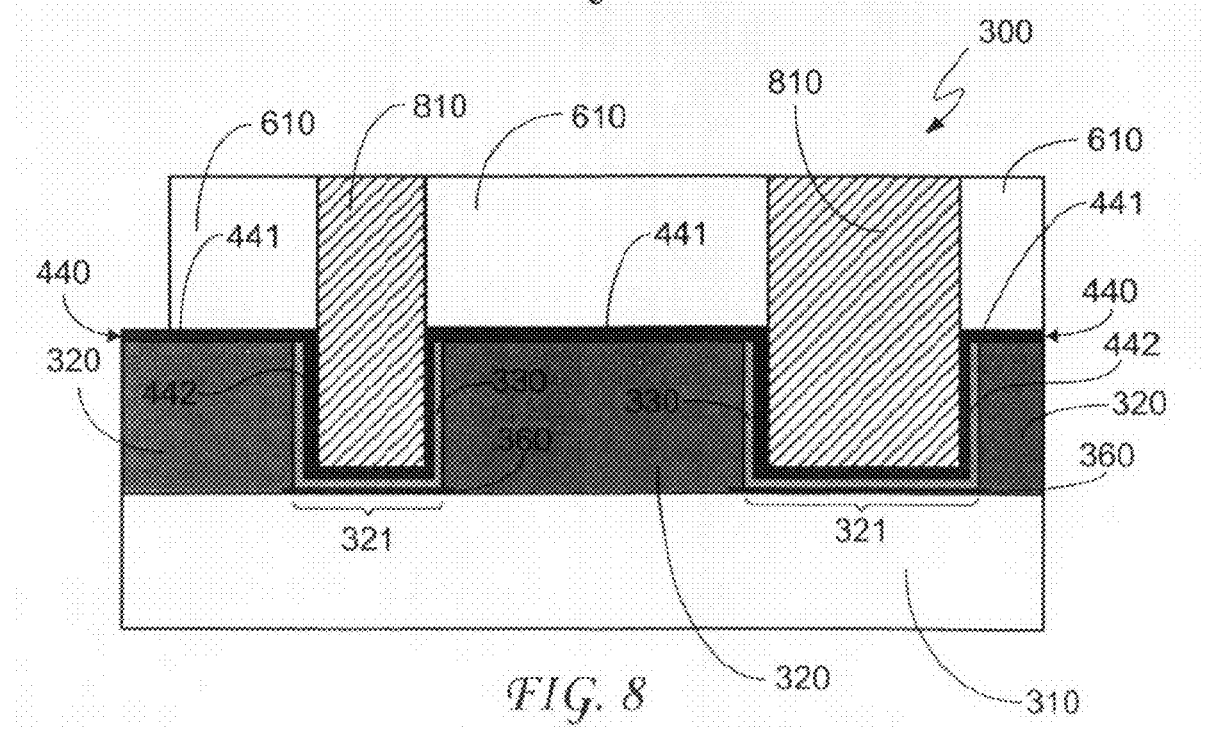
FIG. 8 is a cross-sectional view of the electronic package first shown in FIG. 3 at a particular point in a manufacturing process according to an embodiment of the invention.

In a different embodiment, the electrical connection between solder resist openings 121 is provided by electrically conducting layer 140, and not by finish layer 130 (which is a layer that is separate from electrically conducting layer 140). In FIG. 1, electrically conducting layer 140 is shown at a point in a process flow at which portions of electrically conducting layer 140 have been removed such that the electrical connection between solder resist openings 121 no longer exists. The illustrations in FIGS. 4, 6, and 8, however, depict a similar electronic package (electronic package 300) at stages of a process flow during which such electrical connection is in place. It should be understood that in at least one embodiment, electronic package 100 undergoes processing steps similar to those depicted for electronic package 300.

In one embodiment electrically conducting layer 140 comprises a material selected from the group consisting of tin, nickel, copper, silver, and gold. Of those materials, tin may in at least one embodiment represent the best combination of cost effectiveness, workability, compatibility with existing process flows and materials, and the like. In one embodiment solder material 150 comprises a composite containing tin and silver, and in a particular manifestation of that embodiment solder material 150 comprises approximately 3.5 percent silver. In other embodiments solder material 150 may be any electrically conductive solder material that may be made into small particles.

As mentioned above, electronic package 100 and accompanying manufacturing methods as further described below, including electrokinetic deposition techniques, enable HDI substrate solder bumping for fine pitch electronic packaging. In one embodiment, electronic package 100 is an HDI package in which adjacent ones of solder resist openings 121 are separated by a distance no greater than approximately 140 micrometers. In the same or another embodiment, each one of solder resist openings 121 has a width no greater than approximately 60 micrometers. In a particular embodiment, solder resist openings may have a pitch (separation distance) of approximately 80 micrometers and a width of approximately 40 micrometers. Besides enabling such ultra-fine pitch bumping, electrokinetic deposition is further advantageous because it is relatively independent of solder size characteristics, making it suitable for both solder powder and solder microballs.

Figure 2:
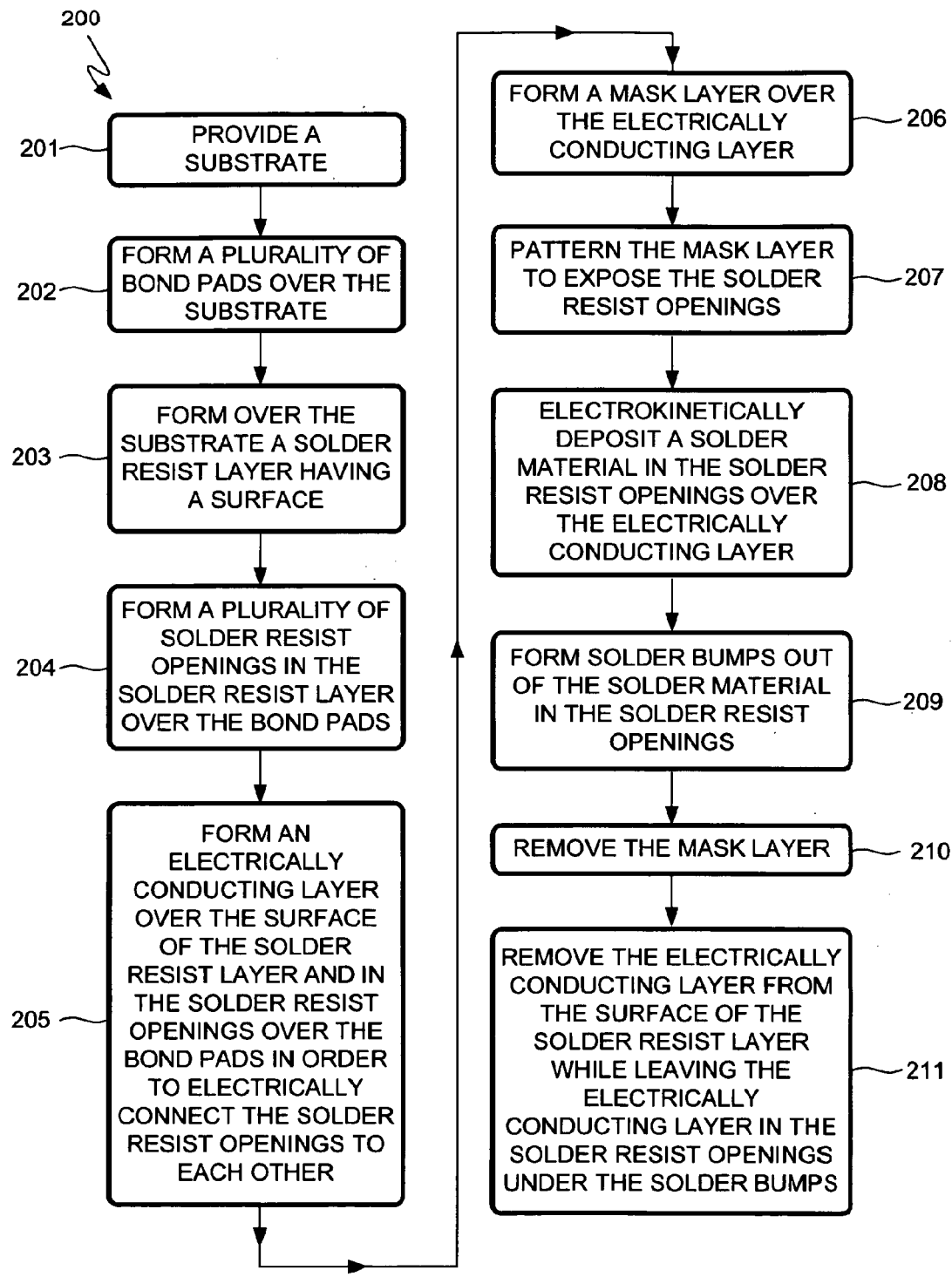
FIG. 2 is a flowchart illustrating a method of manufacturing an electronic package according to an embodiment of the invention.

FIG. 2 is a flowchart illustrating a method 200 of manufacturing an electronic package, such as electronic package 100, according to an embodiment of the invention. A step 201 of method 200 is to provide a substrate. As an example, the substrate can be similar to substrate 110, first shown in FIG. 1.

A step 202 of method 200 is to form a plurality of bond pads over the substrate. As an example, the bond pads can be similar to bond pads 160, first shown in FIG. 1.

A step 203 of method 200 is to form over the substrate a solder resist layer having a surface. As an example, the solder resist layer and the surface can be similar to, respectively, solder resist layer 120 and surface 122, both of which were first shown in FIG. 1.

A step 204 of method 200 is to form a plurality of solder resist openings in the solder resist layer over the bond pads. As an example, the solder resist openings can be similar to solder resist openings 121, first shown in FIG. 1. As another example, the solder resist openings can be similar to solder resist openings 321, first shown in FIG. 3.

Figure 3:
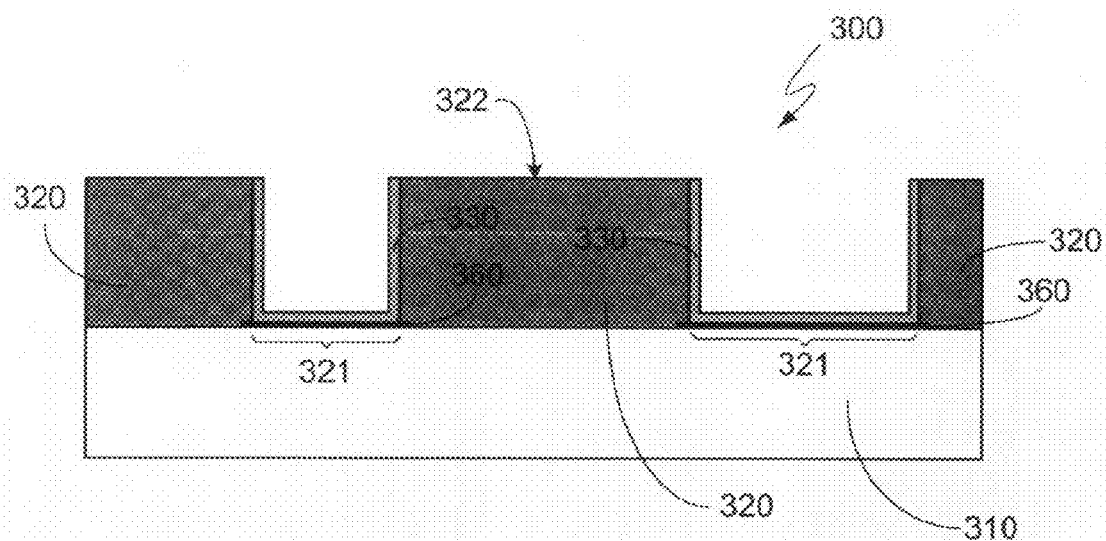
FIG. 3 is a cross-sectional view of an electronic package at a particular point in a manufacturing process according to an embodiment of the invention.

FIG. 3 is a cross-sectional view of an electronic package 300 at a particular point in the manufacturing process of method 200 according to an embodiment of the invention. As mentioned above, FIG. 3 illustrates solder resist openings 321, which can be similar to solder resist openings 121 that were shown in FIG. 1. FIG. 3 further illustrates a solder resist layer 320 having a surface 322, solder resist openings 321 in solder resist layer 320, a substrate 310 under solder resist layer 320, and bond pads 360 over substrate 310 adjacent to solder resist openings 321. As an example, solder resist layer 320, surface 322, substrate 310, and bond pads 360 can be similar to, respectively, solder resist layer 120, surface 122, substrate 110, and bond pads 160, all of which were first shown in FIG. 1.

A step 205 of method 200 is to form an electrically conducting layer over the surface of the solder resist layer and in the solder resist openings over the bond pads in order to electrically connect the solder resist openings to each other. As an example, the electrically conducting layer can be similar to electrically conducting layer 140, first shown in FIG. 1. In one embodiment, step 205 comprises electrolessly depositing the electrically conducting layer, and in a particular embodiment, step 205 comprises electrolessly depositing a layer comprising a material selected from the group consisting of tin, nickel, copper, silver, and gold. In a different embodiment, step 205 can comprise a sputtering or other vapor deposition step.

In one embodiment step 205 comprises forming, electrolessly or otherwise, a finish layer in the solder resist openings and conformally forming the electrically conducting layer such that the electrically conducting layer comprises a first portion over the surface of the solder resist layer and a second portion over the finish layer in the solder resist openings. As an example, the finish layer can be similar to finish layer 130, first shown in FIG. 1. As another example, the electrically conducting layer can be similar to an electrically conducting layer 440, first shown in FIG. 4.

Figure 4:
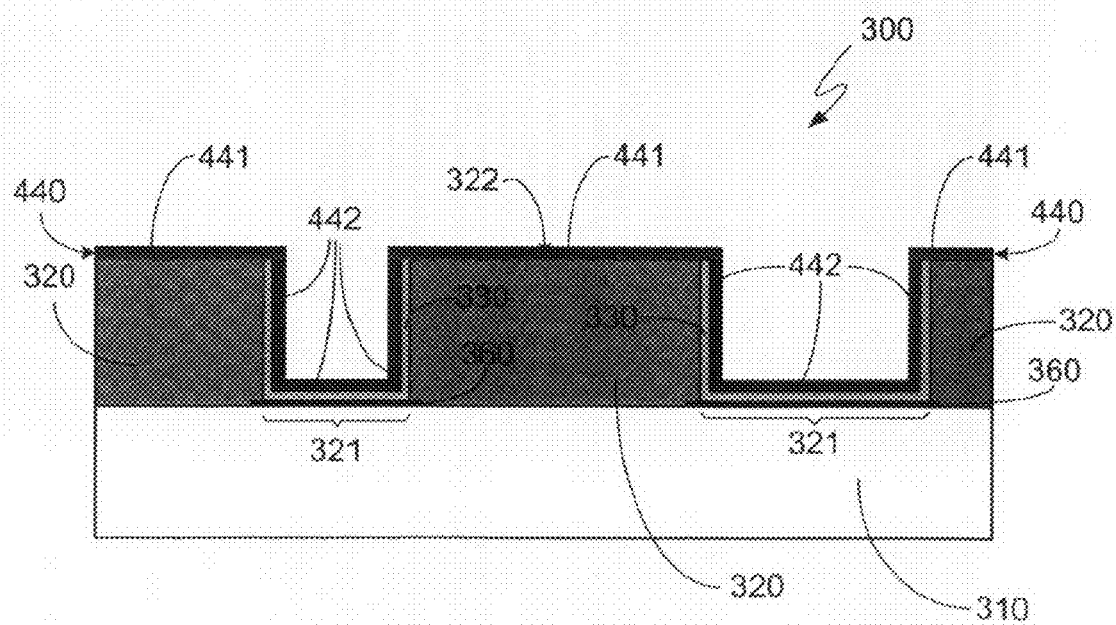
FIG. 4 is a cross-sectional view of the electronic package at a different point in a manufacturing process according to an embodiment of the invention.

FIG. 4 is a cross-sectional view of electronic package 300 at a particular point in the manufacturing process of method 200 according to an embodiment of the invention. As illustrated in FIG. 4, electrically conducting layer 440 comprises a portion 441 over surface 322 of solder resist layer 320 and a portion 442 over finish layer 330 in solder resist openings 321. (It will be noted that portion 441 is not continuous, but instead is broken by sections of portion 442. Portion 442 is similarly broken by sections of portion 441. Nevertheless, portions 441 and 442 are referred to as a unit. Other layers described herein that are similarly disjointed, whether initially or following one or more processing steps, may be referred to in a similar manner, whether such layers are introduced above or are to be introduced below.) As an example, the first portion of the electrically conducting layer and the second portion of the electrically conducting layer formed in step 205 can be similar to, respectively, portion 441 and portion 442 of electrically conducting layer 440, shown in FIG. 4. As another example, the second portion of the electrically conducting layer formed in step 205 can be similar to electrically conducting layer 140 shown in FIG. 1, which is a remaining portion of a larger electrically conducting layer (not shown) that was in place prior to certain processing steps that produced electronic package 100 of FIG. 1.

The formation of the electrically conducting layer of step 205 according to one embodiment has just been discussed. In a different embodiment, step 205 comprises conformally forming, electrolessly or otherwise, a finish layer having a first portion over the surface of the solder resist layer and a second portion in the solder resist openings. In that different embodiment, the finish layer performs both the functions of a traditional finish layer and the functions of the electrically conducting layers described herein. As stated above, one of the functions of the described electrically conducting layers is to electrically connect the solder resist openings to each other. The functions of a traditional finish layer were discussed previously.

As an example, the finish layer described in the preceding paragraph can be similar to a finish layer 535, first shown in FIG. 5, which is a cross-sectional view of an electronic package 500 at a particular point in the manufacturing process of method 200 according to an embodiment of the invention. As illustrated in FIG. 5, electronic package 500 comprises a substrate 510 and a solder resist layer 520 over substrate 510. Solder resist layer 520 has a surface 522 and a plurality of solder resist openings 521 therein. Finish layer 535 is located in solder resist openings 521, as shown. Bond pads 560 are located at solder resist openings 521 under finish layer 535.

Finish layer 535 comprises a portion 538 over surface 522 of solder resist layer 520 and a portion 539 in solder resist openings 521. As an example, recalling that finish layer 535 performs both electrical connectivity functions and the functions of a traditional finish layer, portion 538 of finish layer 535 can be similar to portion 441 of electrically conducting layer 440 as shown in FIG. 4, and portion 539 of electrically conducting layer 535 can be similar to a combination of finish layer 330 and portion 442 of electrically conducting layer 440, both of which were shown in FIG. 4. As another example, portion 539 of electrically conducting layer 535 can be similar to a combination of finish layer 130 and electrically conducting layer 140 of electronic package 100, as shown in FIG. 1.

A step 206 of method 200 is to form a mask layer over the electrically conducting layer. As an example, the mask layer can be similar to a mask layer 610, first shown in FIG. 6, which is a cross-sectional view of electronic package 300 at a particular point in method 200 according to an embodiment of the invention. It should be noted that step 206 and subsequent steps of method 200 can be performed on electronic package 500 (see FIG. 5) and other electronic packages in addition to electronic package 300. In order to avoid unnecessarily obscuring the invention, as well as for purposes of simplicity, FIG. 6 does not show electronic package 500, but instead illustrates only electronic package 300.

In one embodiment, step 206 comprises forming a resist layer, such as a dry film resist layer or the like. Accordingly, in one embodiment, mask layer 610 can comprise a dry film resist layer. In another embodiment, mask layer 610 may be a liquid resist, polyimide or some other organic film, or the like. The material used for mask layer 610 should be chosen from among materials that form a suitable bond with the underlying electrically conducting layer formed in step 205, and should exhibit sufficient thermal resistance to withstand solder reflow conditions and temperatures. Regardless of its makeup, mask layer 610 can be patterned and used as a disposable mask. In various embodiments, this disposable mask technique overcomes the problems faced by conventional stencil masks, some of which problems are mentioned above, and allows finer pitch printing and better bump dimensional control than such conventional stencil masks.

Figure 6:
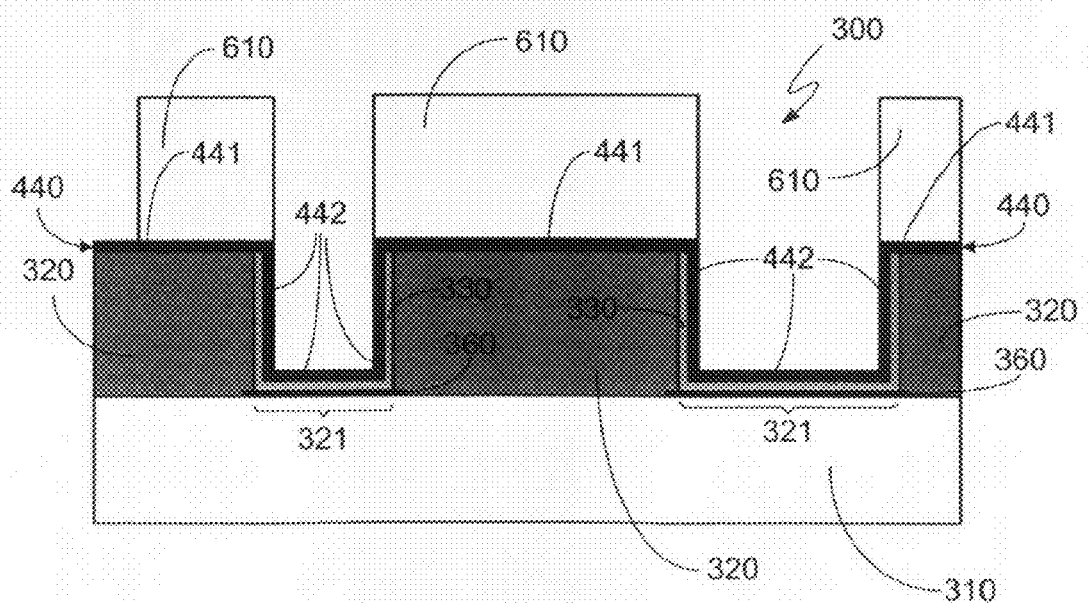
FIG. 6 is a cross-sectional view of the electronic package first shown in FIG. 3 at a particular point in a manufacturing process according to an embodiment of the invention.

A step 207 of method 200 is to pattern the mask layer to expose the solder resist openings. Mask layer 610 in FIG. 6 is depicted as it appears following the patterning of step 207. The patterning of mask layer 610 is done in such a way that the only exposed portion of electrically conducting layer 440 is the portion on which solder deposition is desired. In the embodiment illustrated in FIG. 6, that portion is portion 442 of electrically conducting layer 440.

Figure 7:
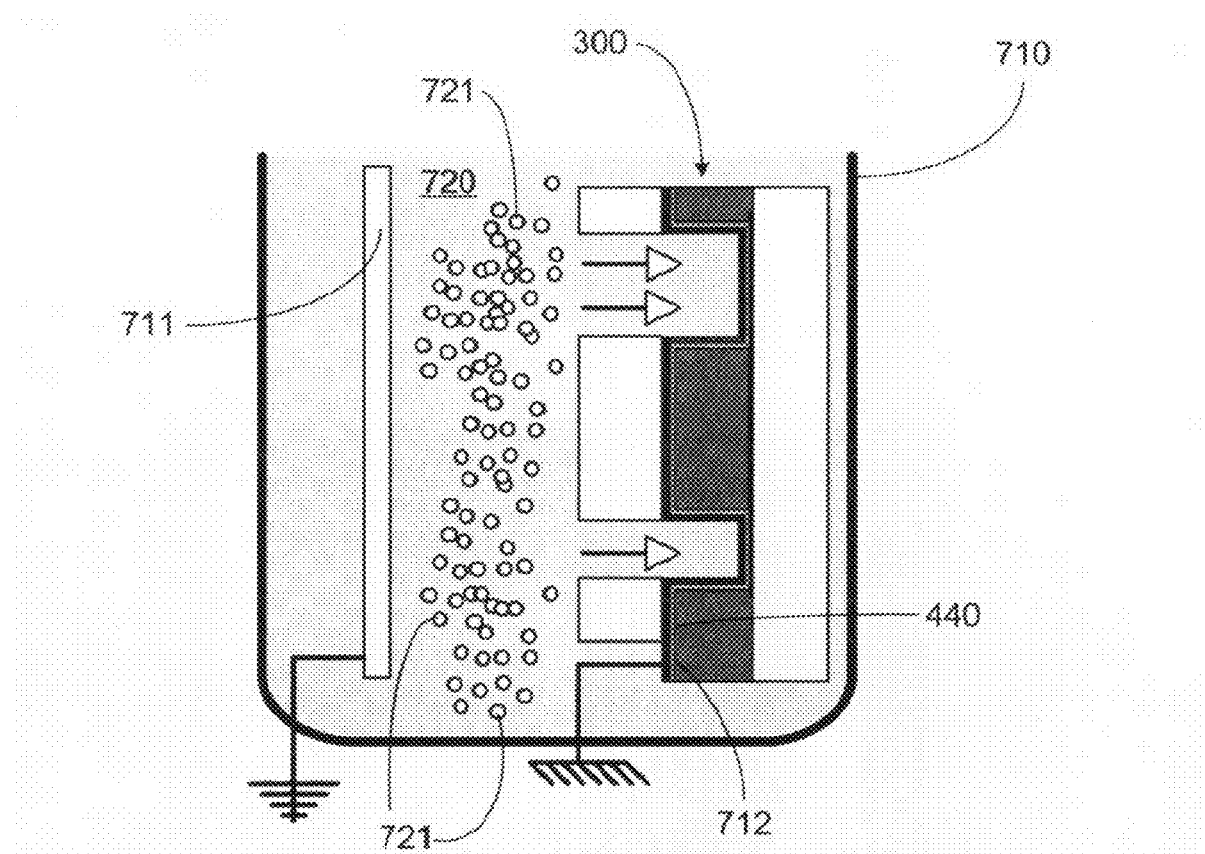
FIG. 7 is a cutaway view of a deposition tank that may be used for the electrokinetic deposition of solder on portions of an electronic package according to an embodiment of the invention.

A step 208 of method 200 is to electrokinetically deposit a solder material in the solder resist openings over the electrically conducting layer. FIG. 7 is a cutaway view of a deposition tank 710 that may be used for the electrokinetic deposition of solder on portions of electronic package 300 according to an embodiment of the invention. In order to avoid unnecessarily obscuring the invention, as well as for purposes of simplicity, FIG. 7 does not show electronic package 500, but instead illustrates only electronic package 300, as was also the case with FIG. 6.

As illustrated in FIG. 7, deposition tank 710 comprises an electrode 711 and an electrode 712, both of which are immersed in a plating bath 720 along with electronic package 300. As illustrated, electrically conducting layer 440 acts as electrode 712. Plating bath 720 comprises solder particles 721. When electrodes 711 and 712 are electrically connected as shown, or in another acceptable configuration, solder particles 721 are attracted to and deposited on exposed portions of electrode 712, i.e., on exposed portions of electrically conducting layer 440.

The foregoing discussion illustrates a reason the electrical connection provided by electrically conducting layer 440 and finish layer 535 in necessary. Without such electrical connection one of the two electrodes required by the electrokinetic deposition process would not be present, and the electrokinetic deposition could not proceed. In one embodiment, the solder material deposited in step 208 can be similar to a solder material 810, first shown in FIG. 8, which is a cross-sectional view of electronic package 300 at a particular point in method 200 according to an embodiment of the invention. As an example, solder material 810 can be similar to solder material 150, first shown in FIG. 1, although the solder material depicted in FIG. 8 has not yet been formed into solder bumps or the like. In order to avoid unnecessarily obscuring the invention, as well as for purposes of simplicity, FIG. 8 does not show electronic package 500, but instead illustrates only electronic package 300, as was also the case with FIGS. 6 and 7.

A step 209 of method 200 is to form solder bumps out of the solder material in the solder resist openings. As an example, the solder bumps can be similar to those shown in FIG. 1 and referred to in the accompanying discussion as solder material 150. In one embodiment, the solder bumps are formed by reflowing the solder material according to techniques known in the art.

A step 210 of method 200 is to remove the mask layer. As an example, step 210 can comprise chemically stripping the mask layer using an appropriate chemistry as known in the art.

A step 211 of method 200 is to remove the electrically conducting layer from the surface of the solder resist layer while leaving the electrically conducting layer in the solder resist openings under the solder bumps. Step 211 removes the electrical connection connecting the solder resist openings to each other, leaving the solder resist openings electrically isolated from each other as required for proper operation of the electronic package. As an example, step 211 can comprise etching the electrically conducting layer using an appropriate etchant as known in the art such that the targeted portion of the electrically conducting layer is removed. In at least one embodiment, the performance of step 211 on electronic package 300 makes electronic package 300 look like electronic package 100, shown in FIG. 1.

Figure 9:
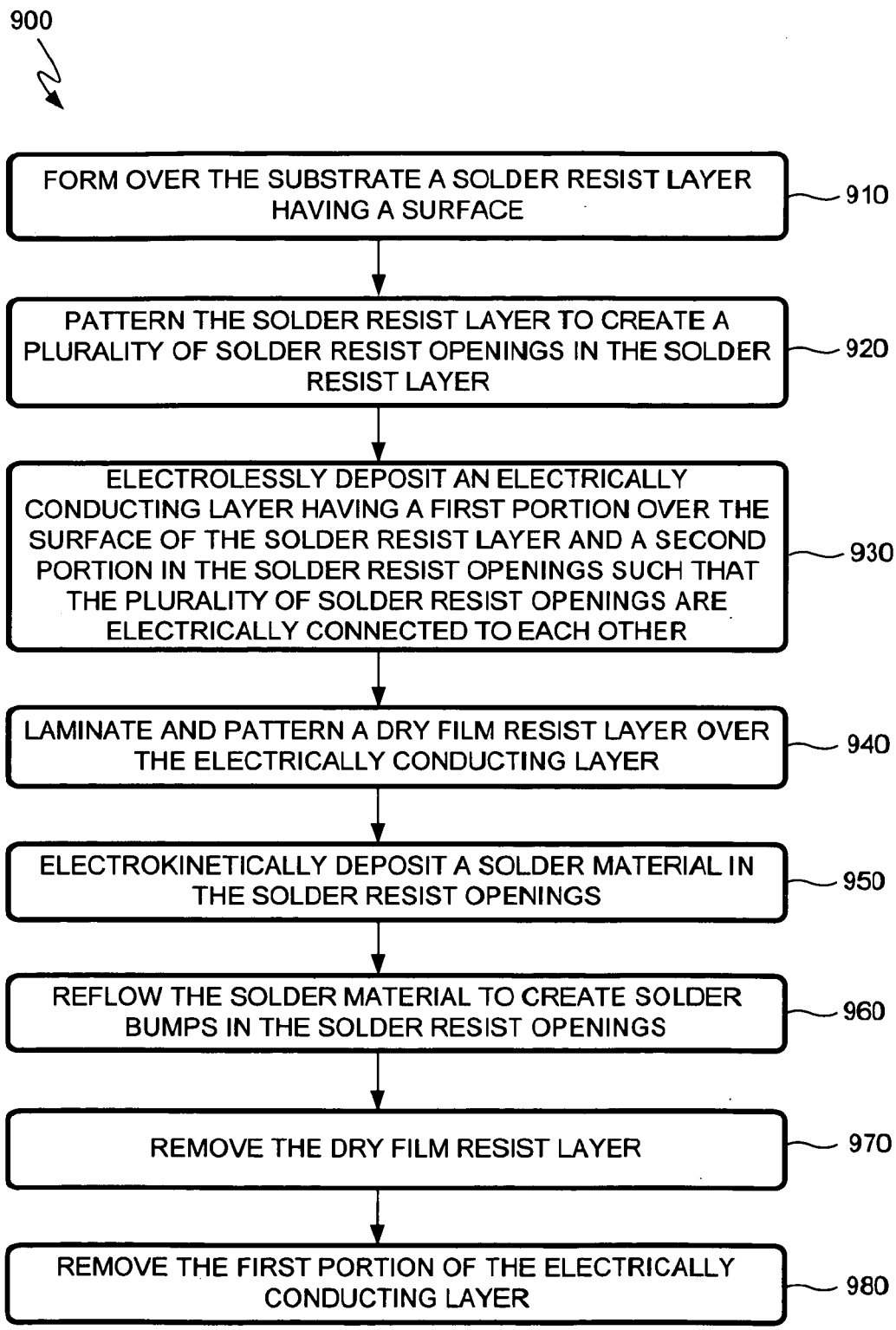
FIG. 9 is a flowchart illustrating a method of enabling solder deposition on a substrate according to an embodiment of the invention.

FIG. 9 is a flowchart illustrating a method 900 of enabling solder deposition on a substrate according to an embodiment of the invention. A step 910 of method 900 is to form over the substrate a solder resist layer having a surface. As an example, the solder resist layer and the surface can be similar to, respectively, solder resist layer 120 and surface 122, both of which are shown in FIG. 1.

A step 920 of method 900 is to pattern the solder resist layer to create a plurality of solder resist openings in the solder resist layer. As an example, the solder resist openings can be similar to solder resist openings 121, shown in FIG. 1. In one embodiment, step 920 comprises forming the solder resist openings with a pitch no greater than approximately 140 micrometers, in accordance with requirements of HDI substrates and ultra-fine pitch and mixed-pitch substrate bumping.

A step 930 of method 900 is to electrolessly deposit an electrically conducting layer having a first portion over the surface of the solder resist layer and a second portion in the solder resist openings such that the plurality of solder resist openings are electrically connected to each other. As an example, the electrically conducting layer, the first portion, and the second portion can be similar to, respectively, electrically conducting layer 440, portion 441, and portion 442, all of which were first shown in FIG. 4. As another example, the electrically conducting layer, the first portion, and the second portion can be similar to, respectively, finish layer 535, portion 538, and portion 539, all of which are shown in FIG. 5. In one embodiment, step 930 comprises electrolessly depositing a layer comprising tin. In another embodiment, step 930 comprises electrolessly depositing a layer comprising a material selected from the group consisting of nickel, copper, silver, and gold.

A step 940 of method 900 is to laminate and pattern a dry film resist layer over the electrically conducting layer. As an example, the dry film resist layer can be similar to mask layer 610, shown in FIG. 6. The dry film resist layer is patterned such that the dry film resist layer covers parts of the electrically conducting layer and exposes only those portions of the electrically conducting layer where the deposition of solder material is desired. In one embodiment, the dry film resist layer is patterned such that it exposes only the electrically conducting layer in the solder resist openings and covers the portions of the electrically conducting layer that overlie the surface of the solder resist layer.

A step 950 of method 900 is to electrokinetically deposit a solder material in the solder resist openings. As an example, the solder material can be similar to solder material 810, shown in FIG. 8.

A step 960 of method 900 is to reflow the solder material to create solder bumps in the solder resist openings. As an example, the solder bumps can be similar to those shown in FIG. 1 and referred to in the accompanying discussion as solder material 150. In one embodiment, step 960 comprises creating solder bumps having a width no greater than approximately 60 micrometers, in accordance with requirements of HDI substrates and ultra-fine pitch and mixed-pitch substrate bumping.

A step 970 of method 900 is to remove the dry film resist layer so as to make room for another component of the electronic package to be placed on the solder resist layer and to be connected thereto via the solder bumps.

A step 980 of method 900 is to remove the first portion of the electrically conducting layer such that the solder resist openings are electrically isolated from each other.

Figure 10:
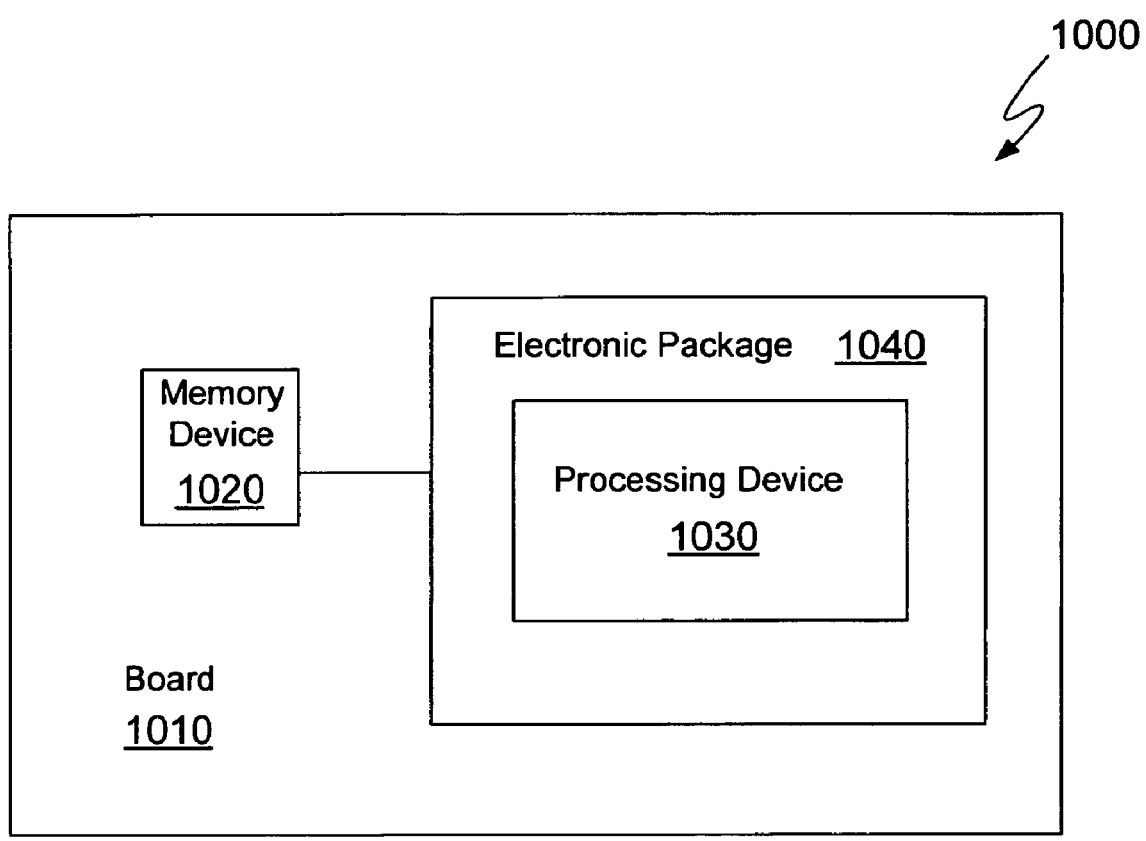
FIG. 10 is a schematic diagram of a system in which an electronic package according to an embodiment of the invention may be used.

FIG. 10 is a schematic diagram of a system 1000 in which an electronic package according to an embodiment of the invention may be used. As illustrated in FIG. 10, system 1000 comprises a board 1010, a memory device 1020 disposed on board 1010, and a processing device 1030 disposed on board 1010 and coupled to memory device 1020. Processing device 1030 is contained within an electronic package 1040 comprising a substrate, a solder resist layer over the substrate and having a plurality of solder resist openings therein, a finish layer in the solder resist openings, an electrically conducting layer in the solder resist openings over the finish layer, and a solder material in the solder resist openings over the electrically conducting layer. As an example, the electronic package can be similar to electronic package 100, shown in FIG. 1. As another example, processing device 1030 can be connected to electronic package 1040 via the solder material.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the electronic package and corresponding methods and system discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of manufacturing an electronic package, the method comprising:
   providing a substrate;
   forming a plurality of bond pads over the substrate;
   forming over the substrate a solder resist layer having a surface;
   forming a plurality of solder resist openings in the solder resist layer over the bond pads;
   forming an electrically conducting layer over the surface of the solder resist layer and in the solder resist openings over the bond pads in order to electrically connect the solder resist openings to each other;
   forming a mask layer over the electrically conducting layer;
   patterning the mask layer to expose the solder resist openings;
   electrokinetically depositing a solder material in the solder resist openings over the electrically conducting layer;
   forming solder bumps out of the solder material in the solder resist openings;
   removing the mask layer; and
   removing the electrically conducting layer from the surface of the solder resist layer while leaving the electrically conducting layer in the solder resist openings under the solder bumps.

2. The method of claim 1 wherein:
   forming the electrically conducting layer comprises:
      forming a finish layer in the solder resist openings; and
      conformally forming the electrically conducting layer such that the electrically conducting layer comprises a first portion over the surface of the solder resist layer and a second portion over the finish layer in the solder resist openings.

3. The method of claim 1 wherein:
   forming the electrically conducting layer comprises conformally forming a finish layer having a first portion over the surface of the solder resist layer and a second portion in the solder resist openings.

4. The method of claim 1 wherein:
   forming the mask layer comprises forming a resist layer.

5. The method of claim 4 wherein:
   forming the resist layer comprises forming a dry film resist layer.

6. The method of claim 1 wherein:
   forming the electrically conducting layer comprises electrolessly depositing the electrically conducting layer.

7. The method of claim 6 wherein:
   forming the electrically conducting layer comprises electrolessly depositing a layer comprising a material selected from the group consisting of tin, nickel, copper, silver, and gold.

8. The method of claim 1 wherein:
   removing the mask layer comprises chemically stripping the mask layer.

9. The method of claim 1 wherein:
   removing the electrically conducting layer comprises etching the electrically conducting layer.

10. A method of enabling solder deposition on a substrate, the method comprising:
   forming over the substrate a solder resist layer having a surface;
   patterning the solder resist layer to create a plurality of solder resist openings in the solder resist layer;
   electrolessly depositing an electrically conducting layer having a first portion over the surface of the solder resist layer and a second portion in the solder resist openings such that the plurality of solder resist openings are electrically connected to each other;
   laminating and patterning a dry film resist layer over the electrically conducting layer;
   electrokinetically depositing a solder material in the solder resist openings;

reflowing the solder material to create solder bumps in the solder resist openings;

removing the dry film resist layer; and removing the first portion of the electrically conducting layer.

11. The method of claim 10 wherein:

patterning the solder resist layer comprises forming the solder resist openings with a pitch no greater than approximately 140 micrometers.

12. The method of claim 11 wherein:

reflowing the solder material to create solder bumps comprises creating solder bumps having a width no greater than approximately 60 micrometers.

13. The method of claim 12 wherein:

electrolessly depositing the electrically conducting layer comprises electrolessly depositing a layer comprising tin.

* * * * *